(12) United States Patent
Vaughn et al.

(10) Patent No.: US 6,590,393 B2
(45) Date of Patent: Jul. 8, 2003

(54) HIGH FREQUENCY LARGE VOLUME RESONATOR

(75) Inventors: James Michael Vaughn, Hoover, AL (US); Edward G. Walsh, Irondale, AL (US); Jan Anthonie den Hollander, Vestavia Hills, AL (US)

(73) Assignee: UAB Research Foundation, Birmingham, AL (US)

( * ) Notice: Subject to any disclaimer, the term of this patent is extended or adjusted under 35 U.S.C. 154(b) by 0 days.

(21) Appl. No.: 09/853,377

(22) Filed: May 11, 2001

(65) Prior Publication Data

US 2002/0050818 A1 May 2, 2002

Related U.S. Application Data

(60) Provisional application No. 60/203,334, filed on May 11, 2000.

(51) Int. Cl.[7] .................................................. G01V 3/00
(52) U.S. Cl. ...................................... 324/318; 324/322
(58) Field of Search ................................. 324/300, 307, 324/309, 318, 319, 320, 322

(56) References Cited

U.S. PATENT DOCUMENTS

| | | | |
|---|---|---|---|
| 4,686,473 A | * 8/1987 | Chesneau et al. | ........... 324/320 |
| 4,751,464 A | * 6/1988 | Bridges | ........................ 324/318 |
| 5,321,360 A | * 6/1994 | Mansfield | .................... 324/322 |
| 5,557,247 A | * 9/1996 | Vaughn, Jr. | .................. 333/219 |
| 5,621,322 A | * 4/1997 | Ehnholm | ..................... 324/318 |
| 5,886,596 A | 3/1999 | Vaughn | ....................... 333/219 |
| 6,252,403 B1 | * 6/2001 | Alsop | .......................... 324/318 |

* cited by examiner

Primary Examiner—Edward Lefkowitz
Assistant Examiner—Dixomara Vargas
(74) Attorney, Agent, or Firm—Benjamin Aaron Adler

(57) ABSTRACT

The present invention provides magnetic resonance imaging coils for pursuing large volume images at high magnetic field strengths of 3 Tesla or higher. Also provided are methods of obtaining images by utilizing such magnetic resonance imaging coils. Specifically, the present invention provides a high field large volume resonator comprising a conductive cavity with segments of coaxial cable with exposed center conductors passing through, thereby creating a voltage node corresponding to the center of the conductive cavity. The cavity dimensions of the high frequency large volume resonator are sufficiently large to accommodate a human subject or other appropriate subject of similar size.

21 Claims, 11 Drawing Sheets

HIGH FREQUENCY LARGE VOLUME RESONATOR

CROSS REFERENCE TO RELATED APPLICATION

This non-provisional patent application claims benefit of provisional patent application U.S. Serial No. 60/203,334, filed May 11, 2000, now abandoned.

FEDERAL FUNDING LEGEND

This invention was produced in part using funds obtained through a grant from the National Institutes of Health (1 P41 RR 11811). Consequently, the federal government has certain rights in this invention.

BACKGROUND OF THE INVENTION

1. Field of the Invention

The present invention relates generally to the field of magnetic imaging. More specifically, the present invention relates to a magnetic resonance imaging coil designed to support the combination of a large imaging volume at high magnetic field strengths.

2. Description of the Related Art

The magnetic resonance phenomenon is a phenomenon in which atomic nuclei placed in a static magnetic field and having non-zero spins and magnetic moments absorb and emit electromagnetic-wave energy at specific resonant frequencies. The atomic nuclei are excited to resonance at the Larmor angular frequency given by $\omega_o = \gamma H_o$, wherein $\gamma$ is the gyromagnetic ratio inherent in the atomic nuclei and $H_o$ is the strength of the static magnetic field.

The apparatus adapted to make in vivo diagnosis utilizing the above principle performs signal processing on electromagnetic waves having the same frequency as above and induced after the resonance absorption, thereby obtaining diagnostic information of an object to be examined.

To acquire diagnostic information utilizing magnetic resonance, the whole body of a human subject placed in a static magnetic field may be excited to acquire magnetic resonance signals from the whole body. In view of constraints on construction of apparatus and clinical requirements for magnetic resonance images, however, actual apparatuses are adapted to excite a specific body region of the subject and acquire magnetic resonance signals from the body region.

A specific body region is generally defined by a radio-frequency (RF) magnetic field (a RF pulse) produced by a radio-frequency magnetic field producing coil and gradient magnetic fields produced by gradient magnetic field producing coils. The subject to be examined is placed within a radio-frequency coil system such as a saddle-shaped whole-body coil. The position and thickness of a selected slice for diagnosis are determined by a radio-frequency magnetic field (a RF pulse) produced by the whole-body coil and gradient magnetic fields Gx, Gy and Gz produced by gradient magnetic field producing coils. In this case, the spatial distribution of the radio-frequency magnetic field is determined by coil characteristics such as the coil pattern shape, the distribution and capacitances of distributed capacitors, as well as the conductivity and dielectric constant of the subject to be examined.

When a whole-body coil is used, non-uniformity will be produced in the radio-frequency magnetic field distribution because of the influence of the coil characteristics. In addition, the spatial distribution of radio-frequency magnetic field will be distorted (become non-uniform) within the subject because of its conductivity, permeability, and boundary condition depending on the radio-frequency magnetic field characteristics produced by the coil. These factors could produce irregularities in sensitivity in obtained MR images. For example, in a magnetic resonance imaging apparatus utilizing such a high magnetic field as 3 Tesla and greater, the propagation effects due to the short wavelength of the resonance frequency and other physical limitations of existing coil designs, prevents acquisition of MRI information.

Therefore, The prior art is deficient in the lack of effective apparatus/means of imaging large volume subject at high magnetic field strengths ($\geq 3$ Tesla). The present invention fulfills this long-standing need and desire in the art.

SUMMARY OF THE INVENTION

The present invention is directed to a high frequency large volume resonator (HFLVR), which is an adaptation of a design intended for small volumes and high fields. A high frequency large volume resonator is a magnetic resonance imaging coil designed to support the combination of a large imaging volume at high magnetic field strengths of 3 Tesla and higher.

In one embodiment of the present invention, there is provided a magnetic resonance imaging coil, comprising a conductive cavity supported by an outer shell; a first transverse plane with hole structure, which is connected to the first end of the conductive cavity; a second transverse plane with hole structure, which is connected to the opposing end of the conductive cavity; and coaxial cables, wherein the cables are fed through the first transverse plane via the hole structure, through the conductive cavity of the HFLVR, and through the second transverse plane via the hole structure, and wherein the cables have an open end and an end opposing the open end, wherein the end opposing the open end is connected with a tuning network. Preferably, the coaxial cables within each pair are separated by 60°. Appropriate capacitive and inductive components may be substituted to simulate the open coaxial cables (stubs).

In another embodiment of the present invention, there is provided a linear mode magnetic resonance imaging coil, comprising a conductive cavity supported by an outer shell; a first transverse plane with four holes, which is connected to the first end of the conductive cavity; a second transverse plane with four holes, which is connected to the second end of the conductive cavity; and two pairs of coaxial cables, wherein the cables within each pair are separated by 60° and the cable pairs are separated by 180°, and wherein the cables are fed through the first transverse plane via the holes, through the conductive cavity, and through the second transverse plane via the holes, and wherein each cable has an open end and an end opposing the open end, and wherein the open end of second pair cables is on the opposing end of the conductive cavity compared to the open end of first pair cables, and wherein the end opposing the open end of the first pair cables and the end opposing the open end of the second pair cables are connected with a tuning network. Alternatively, additional toroidal end rings may be attached to the outer shell to enclose the tuning and coaxial cable network.

In still another embodiment of the present invention, there is provided a quad mode magnetic resonance imaging coil, comprising a conductive cavity supported by an outer shell;

a first transverse plane with eight holes, which is connected to the first end of the conductor; a second transverse plane with eight holes, which is connected to the second end of the conductor; and four pairs of coaxial cables, wherein each pair cables are separated by 60° and the 4 pairs are separated by 90°. The coaxial cables are fed through the first transverse plane via the holes, through conductive cavity, and through the second toroidal transverse end plane via the holes, and wherein the each pair cables have an open end and an end opposing the open end, wherein the end opposing the open end are connected with a tuning network. Alternatively, additional toroidal end rings may be attached to the outer shell to enclose the tuning and coaxial cable network. Alternatively, additional toroidal end rings may be attached to the outer shell to enclose the tuning and coaxial cable network. Appropriate capacitive and inductive components may be substituted to simulate the open coaxial cables (stubs).

Further provided in the present invention are methods of imaging a subject of large volume by applying the magnetic resonance imaging coils disclosed herein to the subject in a magnetic field, thereby obtaining a magnetic resonance image. Preferably, the magnetic field has a strength of at least 3 Tesla. The subject is selected from the group consisting of a human body and an animal body.

Other and further aspects, features, and advantages of the present invention will be apparent from the following description of the presently preferred embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate preferred embodiments of the invention and therefore are not to be considered limiting in their scope.

FIG. 4 also shows that the linear mode HFLVR contains two pairs of coaxial cables ($P_1$–$P_2$). The cables within each pair are separated by 60° and the pairs P1 and P2 oppose each other.

FIG. 5 also shows that the quad mode HFLVR contains four pairs of coaxial cables ($P_1$–$P_4$). The cables within each pair are separated by 60°. The pairs P1 and P2 form an opposing set and pairs P3 and P4 form an opposing set. All pairs are separated by 90°.

DETAILED DESCRIPTION OF THE INVENTION

Figure 1:
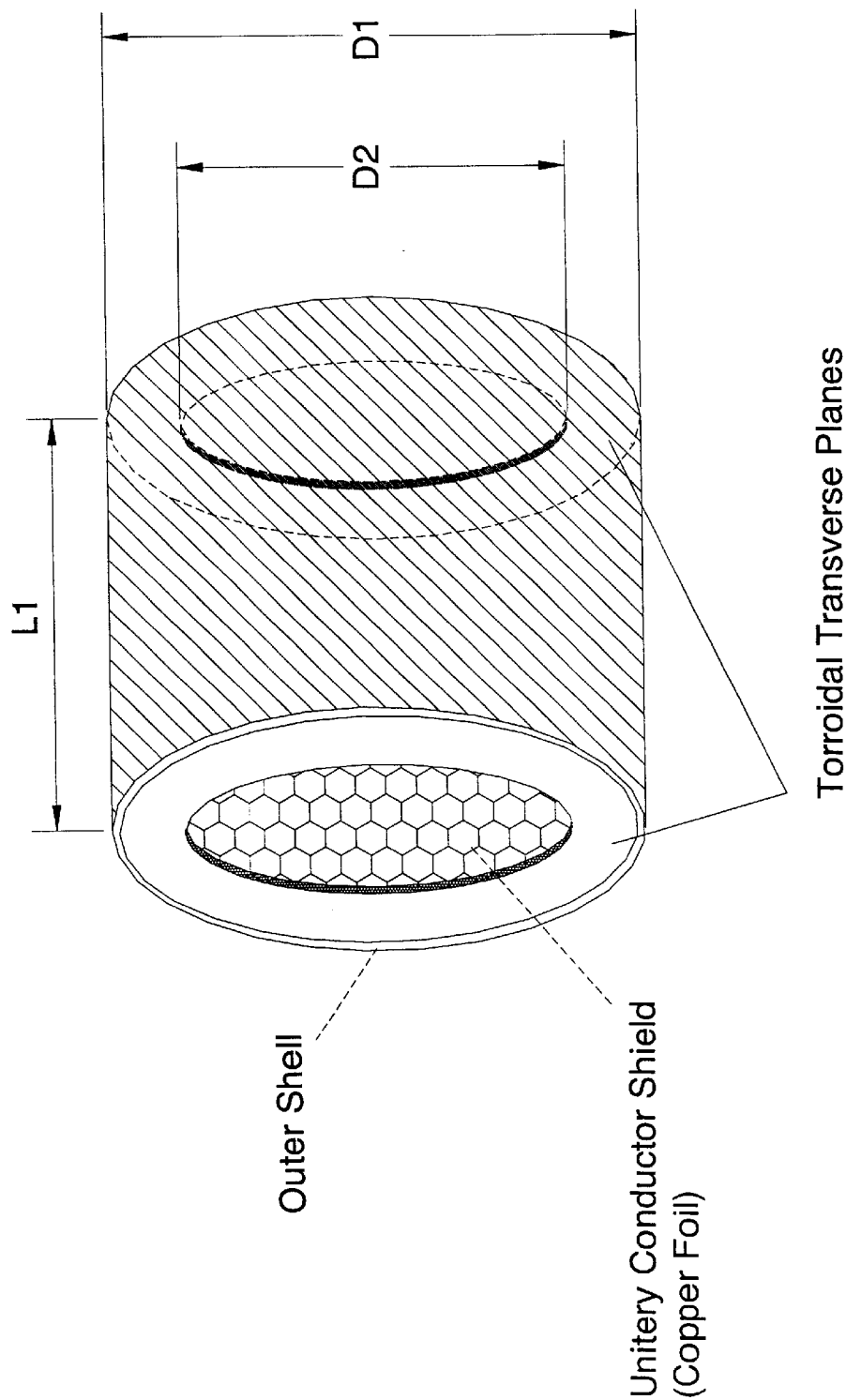
FIG. 1 shows the outer structure of the coil which may be formed with a solid acrylic cylinder or other appropriate material or an assembly of parts of appropriate materials, forming a cylinder. A conductive layer of thin copper foil lines the inner surface of the outer structure, forming a conductive cavity. The conductive cavity functions as a Faraday shield. The shape of the outer structure is basically cylindrical but may also be elliptical. The length of imaging volume (L1) and the diameter (D1) is dependent on magnetic frequency and the dimensions of the object being imaged. Also shown is a conductive cavity with attached toroidal transverse end planes, one on each end. D2 is the diameter of the opening in each toroidal transverse end plane. The two toroidal transverse end planes are identical and have openings (D2) to allow the subject to extend through the coil if necessary. The inner surface of the toroidal transverse end planes are lined with copper foil. The toroidal transverse end planes have through holes to allow for coaxial cables to pass through the coil structure. The number of holes are (but not limited to) four for linear mode operation and eight (but not limited to) for quadrature mode operation.

The present invention is directed to a high frequency large volume resonator (HFLVR), which is a magnetic resonance imaging coil designed to support the combination of a large imaging volume at high magnetic field strengths (>3 Tesla). Such apparatus can be used for whole human body imaging at magnetic field strengths greater than previously possible, taking advantage of the greater sensitivity and resolution that high magnetic fields offer. In addition, such apparatus overcomes the wavelength limitation that current designs have at a combination of high field and large volumes. It is suitable for use as a transmit coil, or for use with receive only coils.

In the present invention, the following terms have the definitions set below.

As used herein, "magnetic resonance imaging coil" shall refer to an apparatus that transmits and/or receives radio frequency energy for the purpose of establishing a homogenous magnetic field within the imaging volume of the coil.

As used herein, "whole-body imaging coil" shall refer to a magnetic resonance imaging coil with sufficient homogenous imaging volume to accommodate a whole human or similar sized subject.

As used herein, "transmit coil" shall refer to a magnetic resonance imaging coil used to transmit radio frequency signals for the purpose of stimulating the sample under test.

As used herein, "receive only coil" shall refer to a magnetic resonance imaging coil used to receive radio frequency signals emitted from the sample under test.

As used herein, "high frequency large volume resonator (HFLVR)" shall refer to a magnetic resonance imaging coil that is tuned to operate at a field strength of 3 Tesla and greater and constructed in a manner to establish a sensitive volume large enough to accommodate a whole human or similarly size subject.

As used herein, "magnetic field strength" shall refer to the field strength of the magnet used in the magnetic imaging system, measured in Tesla.

As used herein, "high magnetic field strength" shall refer to a magnetic field strength roughly 3 Tesla and greater.

As used herein, "imaging volume" shall refer to the available homogenous region within the imaging coil.

As used herein, "large imaging volume" shall refer to an imaging volume within an imaging coil large enough to accommodate an average (or greater) size human subject or any appropriate subject of similar size.

As used herein, "outer shell" shall refer to the outer most portion of the high frequency large volume resonator that defines the physical dimensions and provides support for the coil structures.

As used herein, "conductive cavity" shall refer to the portion of the magnet resonance imaging coil that defines the physical volume that is lined with copper foil and is common with the outer conductors of the coaxial cables passing through.

As used herein, "outer conductor" shall refer to the outer most electrically conductive layer of a coaxial cable.

As used herein, "center conductor" shall refer to the inner most electrical conductor of a coaxial cable.

As used herein, "toroidal transverse end plane" shall refer to the plates on opposing ends of the imaging coil that define the length of the coil and provide support and a termination point for the outer conductor of the coaxial cables passing through the coil.

As used herein, "end ring" shall refer to the outer most toroidal rings of a high frequency large volume resonator.

As used herein, "coaxial cable" shall refer to an electrical cable used to transmit radio frequency signals being constructed of a central electrical conductor surrounded by an insulator which itself is surrounded by an outer electrical conductor (or shield). The outer electrical conductor is surrounded by an insulator enclosing the entire structure.

As used herein, "open end" shall refer to the end of the coaxial cable that is terminated with the inner and outer conductors not connected.

As used herein, "¼ wave point ($\lambda/4$)" shall refer to the point along an open ended coaxial cable, measured from the open end, that corresponds to the length of a $\lambda$ wave of a particular frequency.

As used herein, "voltage node" shall refer to the point along an open ended coaxial cable, measured from the open end, that corresponds to the point where the voltage potential alone the coaxial cable is at a minimum.

As used herein, "linear mode" shall refer to a mode of operation where 2 pair of coaxial cables are used in the coil construction and are driven without phase shift.

As used herein, "quad mode" shall refer to a mode of operation where two sets of 2 pair of coaxial cables are driven with a phase difference of 90 degrees.

In one embodiment of the present invention, there is provided a magnetic resonance imaging coil, comprising a conductive cavity supported by an outer shell; a first transverse plane with hole structure, which is connected to the first end of the conductive cavity; a second transverse plane with hole structure, which is connected to the opposing end of the conductive cavity; and coaxial cables, wherein the cables are fed through the first transverse plane via the hole structure, through the conductive cavity of the high frequency large volume resonator, and through the second transverse plane via the hole structure, and wherein the cables have an open end and an end opposing the open end, wherein the end opposing the open end is connected with a tuning network. Preferably, the coaxial cables within each pair are separated by 60°. Appropriate capacitive and inductive components may be substituted to simulate the open coaxial cables (stubs).

In another embodiment of the present invention, there is provided a linear mode magnetic resonance imaging coil, comprising a cylindrical or elliptical outer shell lined on its inner surface with copper foil or mesh to provide electrical continuity. One toroidal transverse end plane with a 4 hole structure is connected to the first end of the outer shell; a second transverse plane with a 4 hole structure is connected to the second end of the outer shell. The inner surface of the toroidal transverse end planes is lined with copper foil or mesh. The copper lining of the inner surface of the outer shell and the inner surface of the toroidal transverse end planes are soldered together to form a continuous copper lining or conductive cavity. A section of coaxial cable is fed through the hole structure within the first toroidal transverse end plane, through the conductive cavity, and through the second toroidal transverse end plane via the hole structure. One section of coaxial cable exists for each of the four holes within the structure. The center conductor of the each coaxial cable is exposed within the conductive cavity by removing the outer insulator and the outer conductor of the coaxial cable. The outer conductor of the coaxial cable is terminated by soldering onto the conductive cavity on the inner surface of the toroidal transverse end planes at each end of the high frequency large volume resonator. One end of the coaxial cable is terminated in an open circuit outside of the cavity of the HFLVR and the other opposing end of the coaxial cable is terminated with a tuning-matching network. The 4 coaxial cables are arranged in 2 pairs with 60° separation between the cables within each pair. The 2 pairs are arranged 180° from each other The length of cable extending outside the cavity and terminated in an open circuit corresponds to the length of a $\lambda/4$ of the frequency of the imaging system, measured from the center of the high frequency large volume resonator. The length of the opposing end of the coaxial cable corresponds to a length of $\lambda/2-3\lambda/4$, also measured from the center of the high frequency large volume resonator. Alternatively, additional toroidal end rings may be attached to the outer shell to enclose the tuning and coaxial cable network. Appropriate capacitive and inductive components may be substituted to simulate the open coaxial cables (stubs).

In still another embodiment of the present invention, there is provided a quad mode magnetic resonance imaging coil, comprising a cylindrical or elliptical outer shell lined on its inner surface with copper foil or mesh to provide electrical continuity. One toroidal transverse end plane, with an 8 hole structure, is connected to the first end of the outer shell; a second transverse plane, with a 8 hole structure, is connected to the second end of the outer shell. The inner surface of the toroidal transverse end planes is lined with copper foil or mesh. The copper lining of the inner surface of the outer shell and the inner surface of the toroidal transverse end planes are soldered together to form a continuous copper lining or conductive cavity. A section of coaxial cable is fed through the hole structure within the first toroidal transverse end plane, through the conductive cavity, and through the second toroidal transverse end plane via the hole structure. One section of coaxial cable exists for each of the 8 holes within the structure. The center conductor of the each coaxial cable is exposed within the conductive cavity by removing the outer insulator and the outer conductor of the coaxial cable. The outer conductor of the coaxial cable is terminated by soldering onto conductive cavity on the inner surface of the toroidal transverse end planes at each end. One end of the coaxial cable is terminated in an open circuit outside of the cavity and the other opposing end of the coaxial cable is terminated with a tuning-matching network. The 8 coaxial cables are arranged in 4 pairs with 60° separation between the cables within each pair. The 4 pairs are arranged 90° from each other. The cable pairs are driven with a phase difference of 90°. The length of cable extending outside the cavity of the high frequency large volume resonator and terminated in an open circuit corresponds to the length of a $\lambda/4$ of the frequency of the imaging system, measured from the center of the high frequency large volume resonator. The length of the opposing end of the coaxial cable corresponds to a length of $\lambda/2-3\lambda/4$, also measured from the center of the high frequency large volume resonator. Alternatively, additional toroidal end rings may be attached to the outer shell to enclose the tuning and coaxial cable network. Appropriate capacitive and inductive components may be substituted to simulate the open coaxial cables (stubs).

Further provided in the present invention are methods of imaging a subject of large volume by applying the magnetic resonance imaging coils disclosed herein to the subject in a magnetic field, thereby obtaining a magnetic resonance image. Preferably, the magnetic field has a strength of at least 3 Tesla. The subject is selected from the group consisting of a human body and an animal body.

The following examples are given for the purpose of illustrating various embodiments of the invention and are not meant to limit the present invention in any fashion.

EXAMPLE 1
Linear Mode HFLVR Construction

Figure 9:
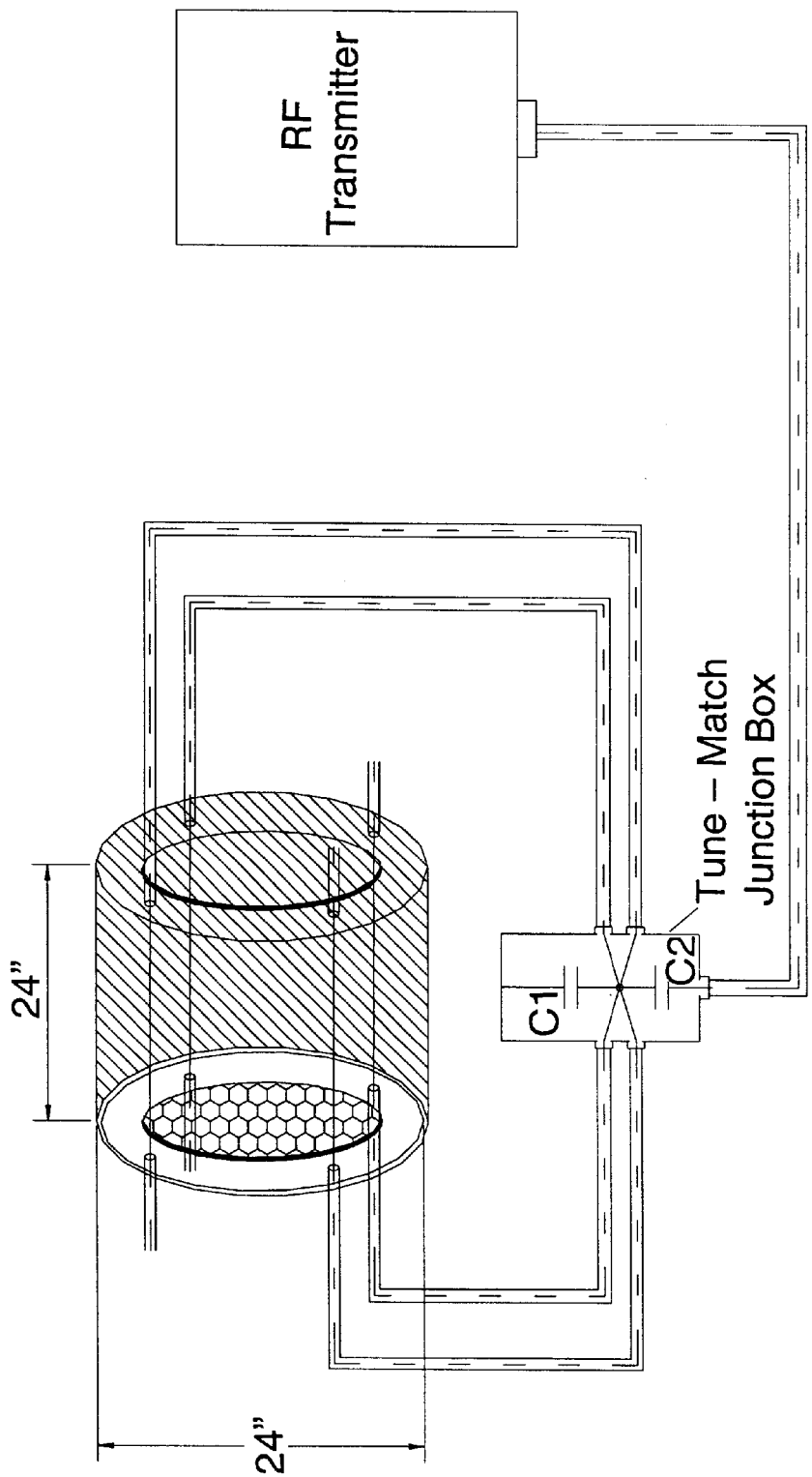
FIG. 9 shows an embodiment of the linear mode HFLVR.

Shown in FIG. 9 is an exemplary linear mode HFLVR, which comprises an acrylic cylinder having the length of imaging volume (L) of 24" and the diameter of the imaging volume (D) of 24". The inner wall is covered with copper foil, which may be solid copper or copper mesh in some configuration.

Toroidal transverse end planes are lined with copper foil on the inner surface. The copper foil on the inner surface is continuous with the copper foil on the inner surface of the outer shell. The two toroidal transverse end planes are connected to the conductive cavity, one on each side. Each toroidal transverse end plane has holes to allow coaxial cables to be fed through the traverse plane, through the cavity of the conductive cavity, and through the transverse plane on the opposing end of conductive cavity. Coaxial cables are fed through the assembly (FIG. 9). The coaxial cable remains intact on the exterior of the conductive cavity. On the interior of the conductive cavity, the center conductor is exposed by removing the outer conductor of the coaxial cable. The outer conductor is terminated on the inner surface of each toroidal transverse end plane. The conductive cavity is continuous with the outer conductor of the coaxial cables. Each transverse plane has a total of 2 pair of 2 holes, separated by 60° within each pair. The 4 coaxial cables are connected at the tune-match junction box.

EXAMPLE 2
Quad Mode HFLVR Construction

Figure 10:
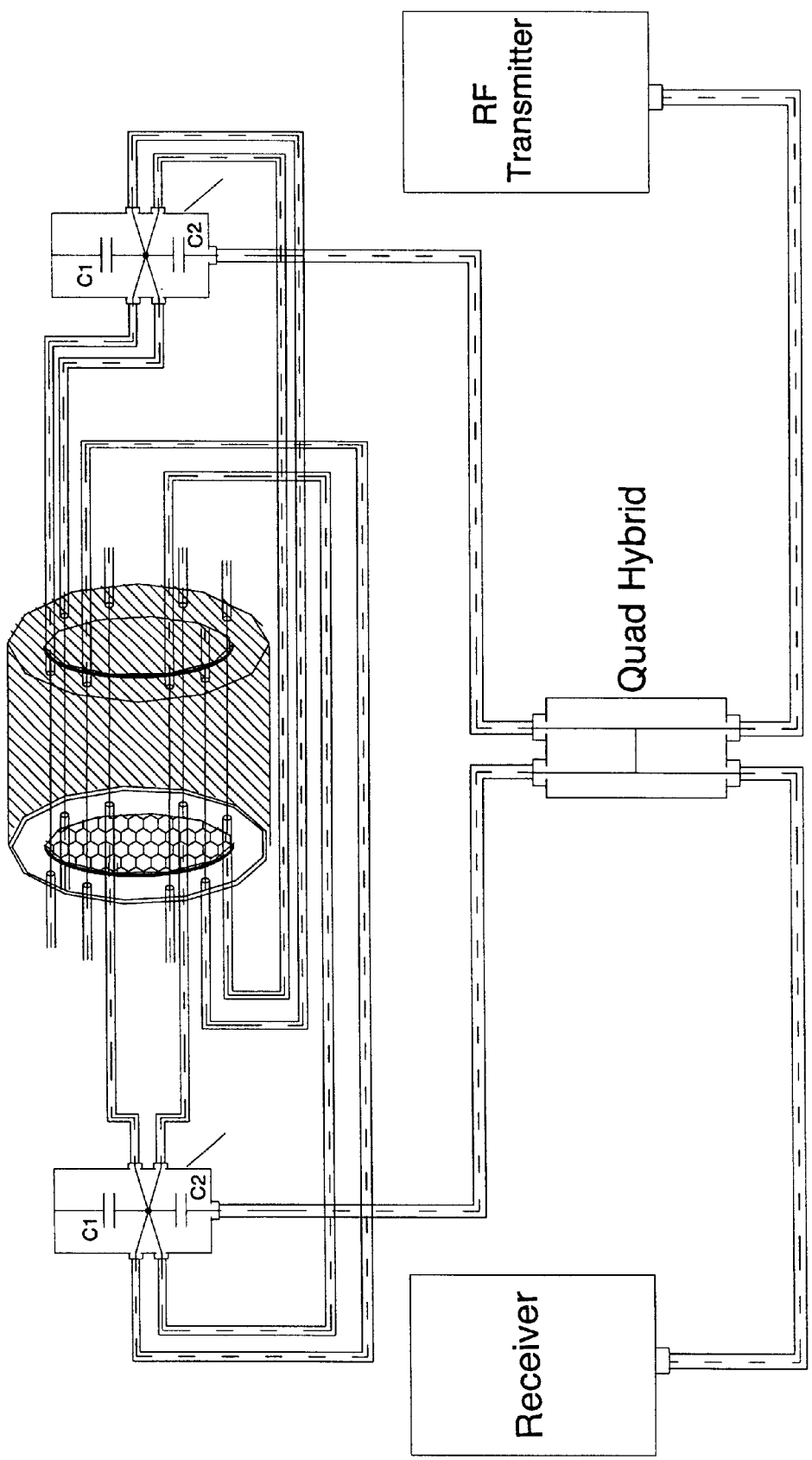
FIG. 10 shows an embodiment of the HFLVR for Quad mode operation with the same configuration as shown in FIG. 9.

Shown in FIG. 10 is an exemplary quad mode high frequency large volume resonator. The inner wall is covered with copper foil, which may be solid copper or copper mesh in some configuration. Toroidal transverse end planes are lined with copper foil on the inner surface. The copper foil on the inner surface is continuous with the copper foil on the inner surface of the outer shell. The two toroidal transverse end planes are connected to the conductive cavity, one on each side. Each toroidal transverse end plane has holes to allow coaxial cables to be fed through the traverse plane, through the cavity of the conductive cavity, and through the transverse plane on the opposing end of the conductive cavity. Coaxial cables are fed through the assembly (FIG. 10). The coaxial cable remains intact on the exterior of the cavity. On the interior of the cavity, the center conductor is exposed by removing the outer conductor of the coaxial cable. The outer conductor is terminated on the inner surface of each toroidal transverse end plane. The conductive cavity is continuous with the outer conductor of the coaxial cables.

Each transverse plane has a total of 4 pair of 2 holes, separated by 60° within each pair. The 4 pairs are separated by 90°. 4 of the coaxial cables are connected at the first tune-match junction box and the other 4 coaxial cables are connected to second tune-match junction box. The inputs to the tune-match junction boxes are driven with a 90° phase shift.

EXAMPLE 3

HFLVR Construction

Figure 2A:
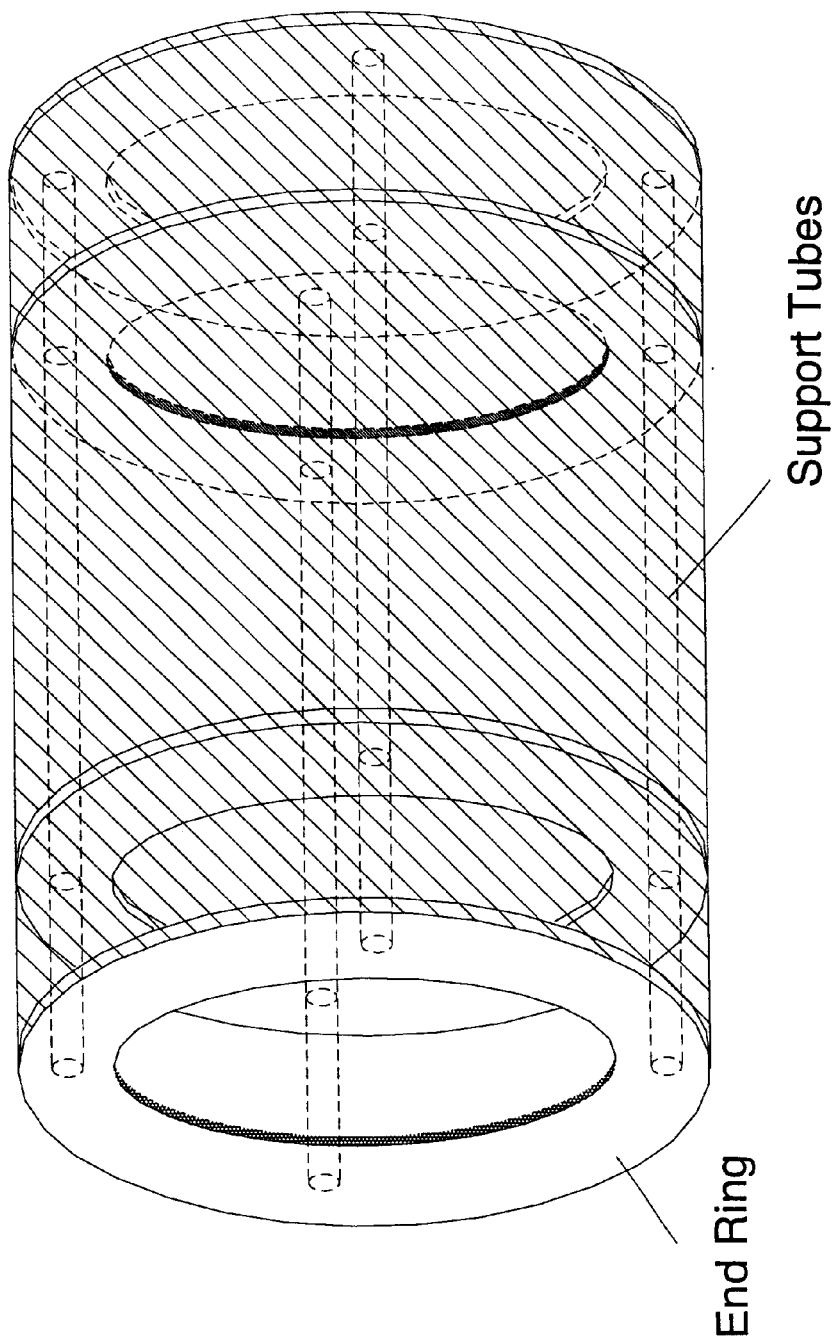
FIG. 2A shows an alternative outer structure of the coil that is shown in FIG. 1, wherein end rings are added creating space between the end rings and the toroidal transverse end planes for mounting capacitors and terminating cables within the coil structure.
Figure 2B:
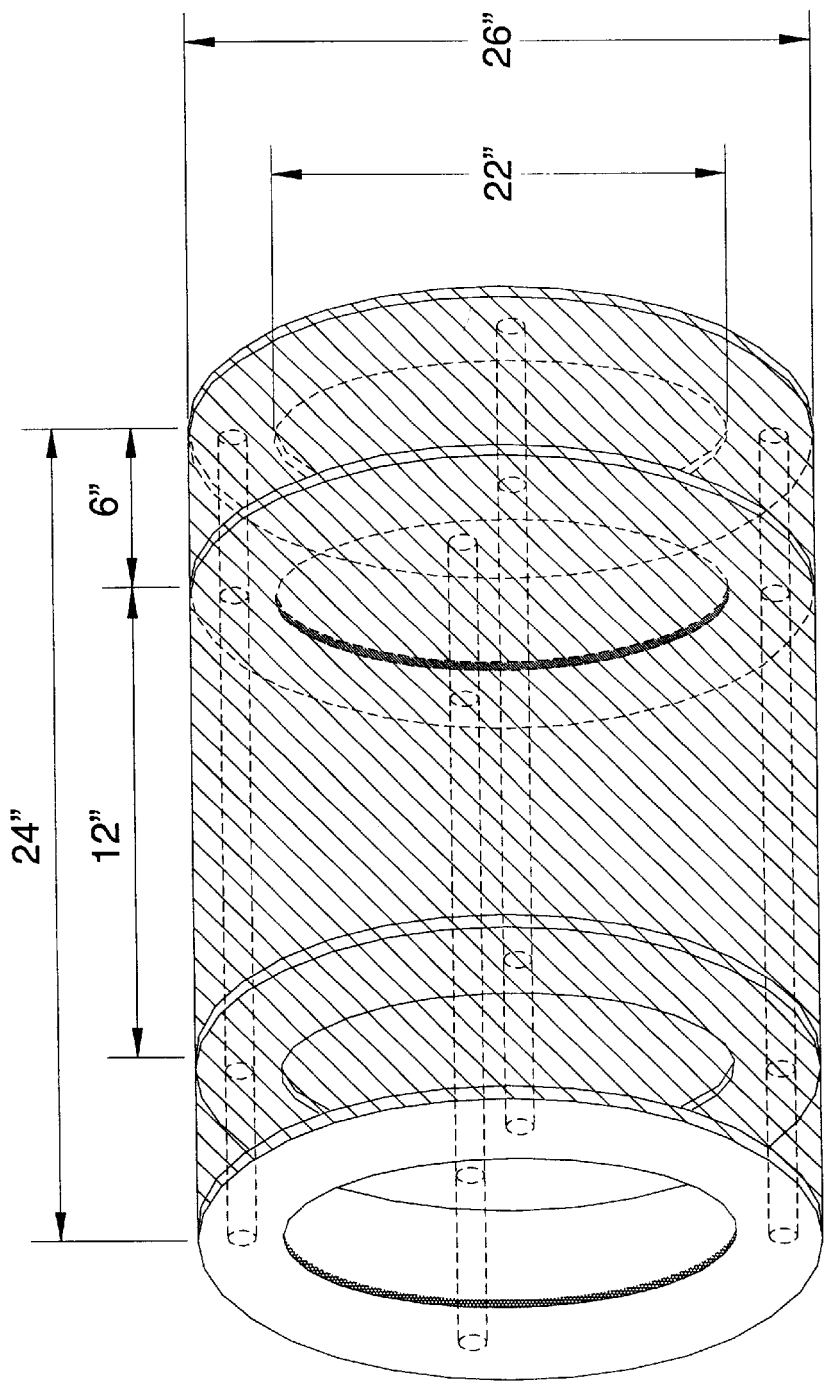
FIG. 2B shows the coil structure with specific parameters.
Figure 3:
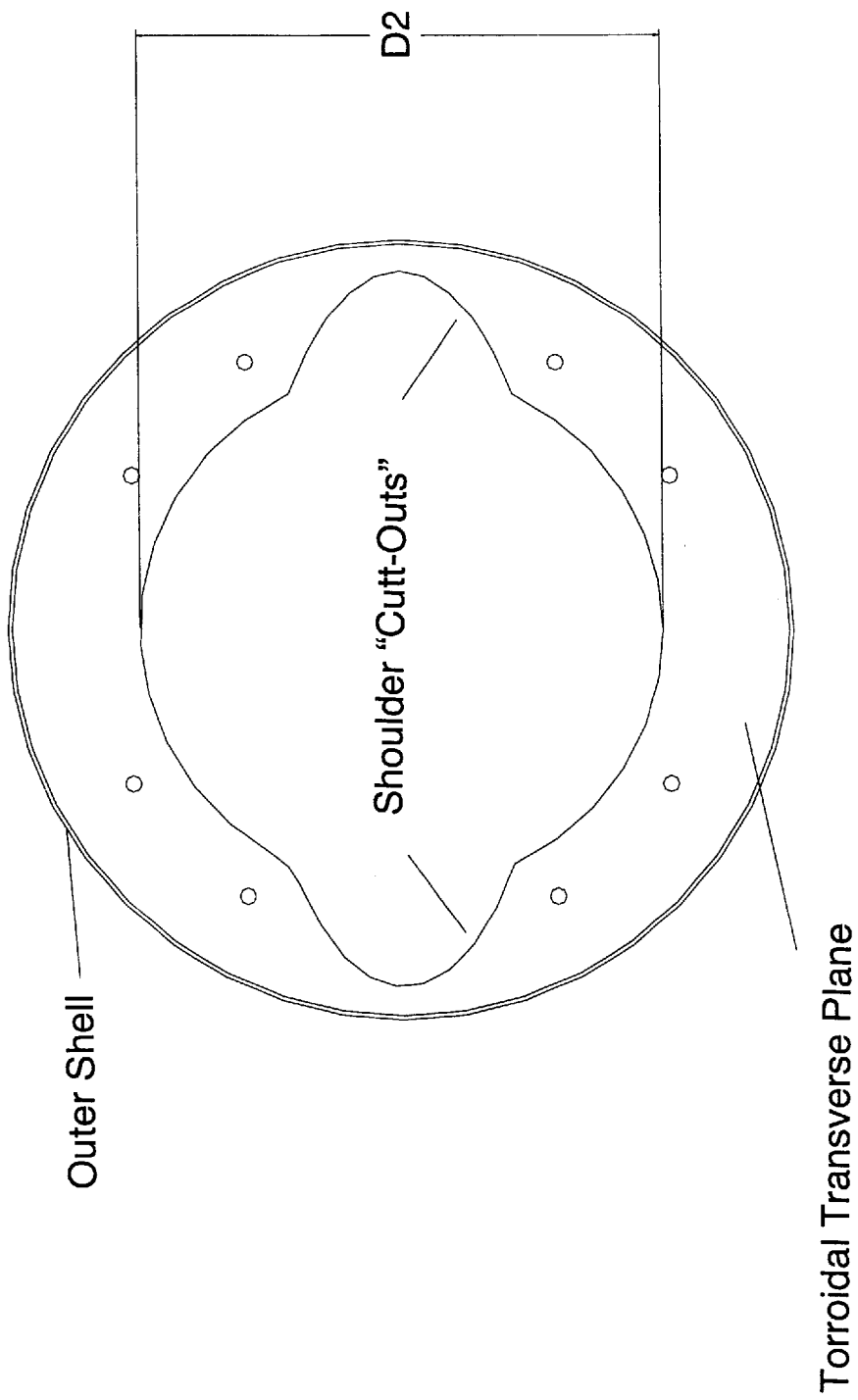
FIG. 3 is a cross-section view of an embodiment of the HFLVR with shoulder "cut-outs" in the toroidal transverse end plane, which provides additional space for the insertion of human subjects. The HFLVR may be constructed with or without "shoulder cut-outs".
Figure 4:
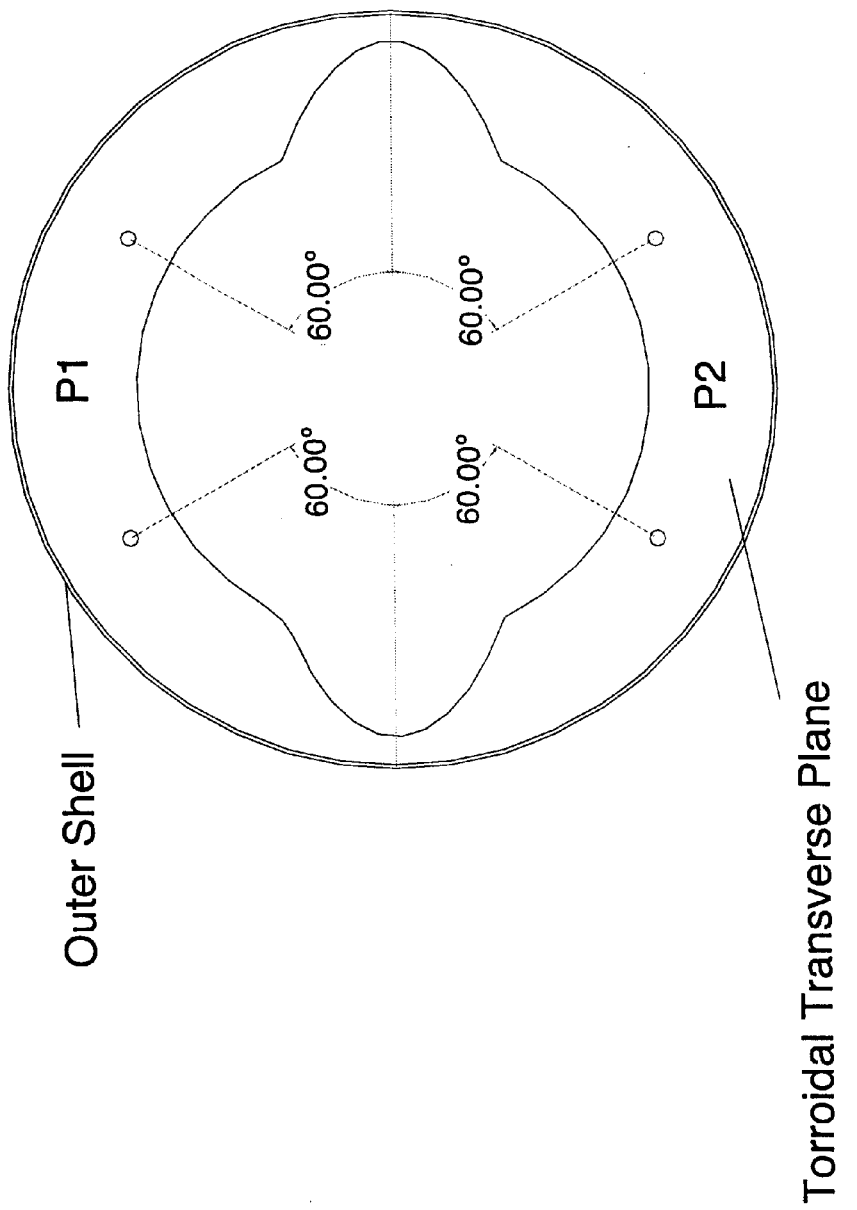
FIG. 4 is a cross-section view of a linear mode HFLVR, wherein each toroidal transverse end plane has a total of 4 holes to allow coaxial cables to be fed through the cavity of the HFLVR, and the toroidal transverse end plane on the opposing end of the HFLVR. The number of coaxial cables for linear mode operation is not necessarily limited to 4.
Figure 5:
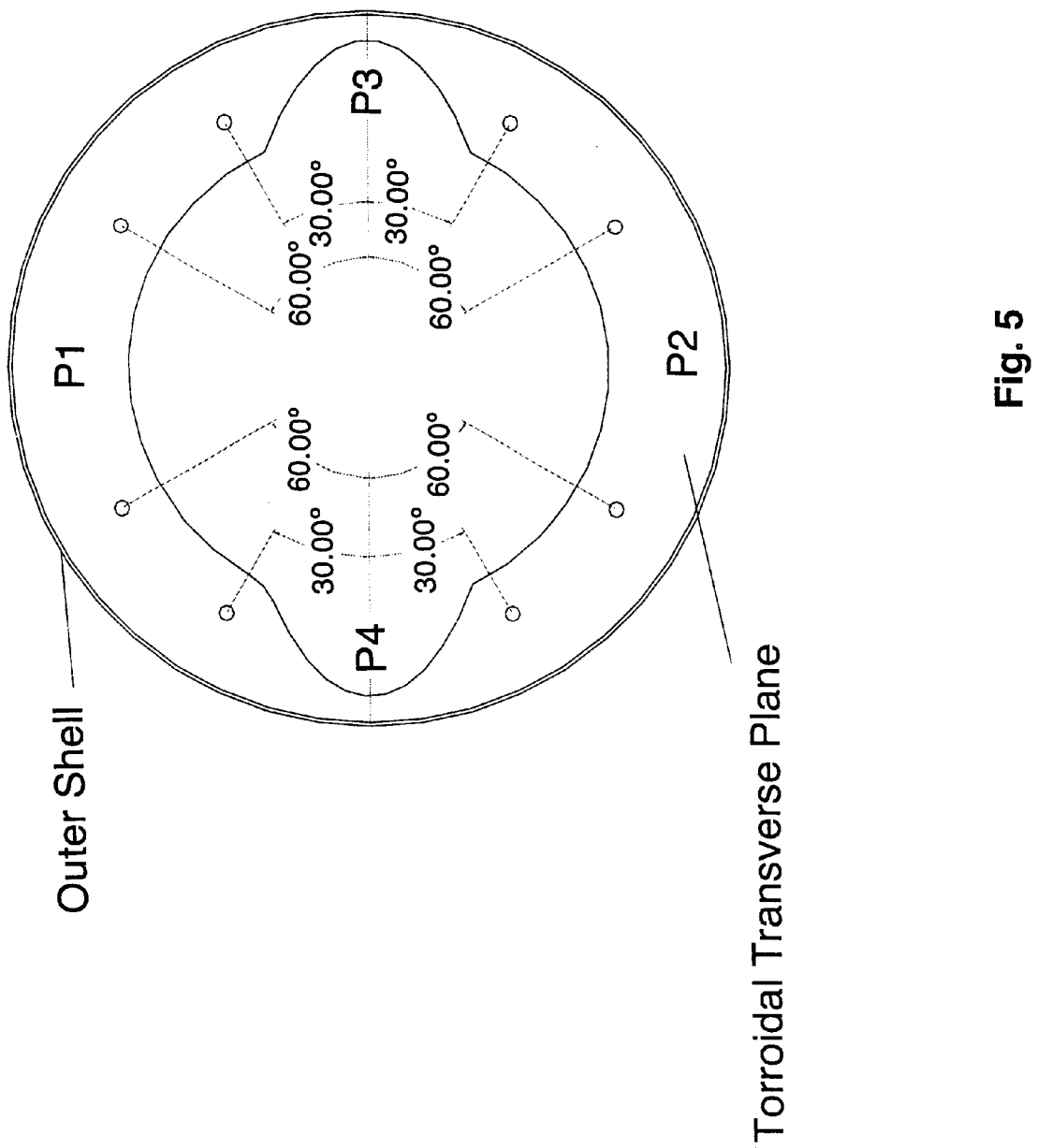
FIG. 5 is a cross-section view of a quad mode HFLVR, wherein each toroidal transverse end plane has a total of 8 holes to allow for the passage of coaxial cables. The number of coaxial cables for quadrature operation is not necessarily limited to 8.
Figure 6:
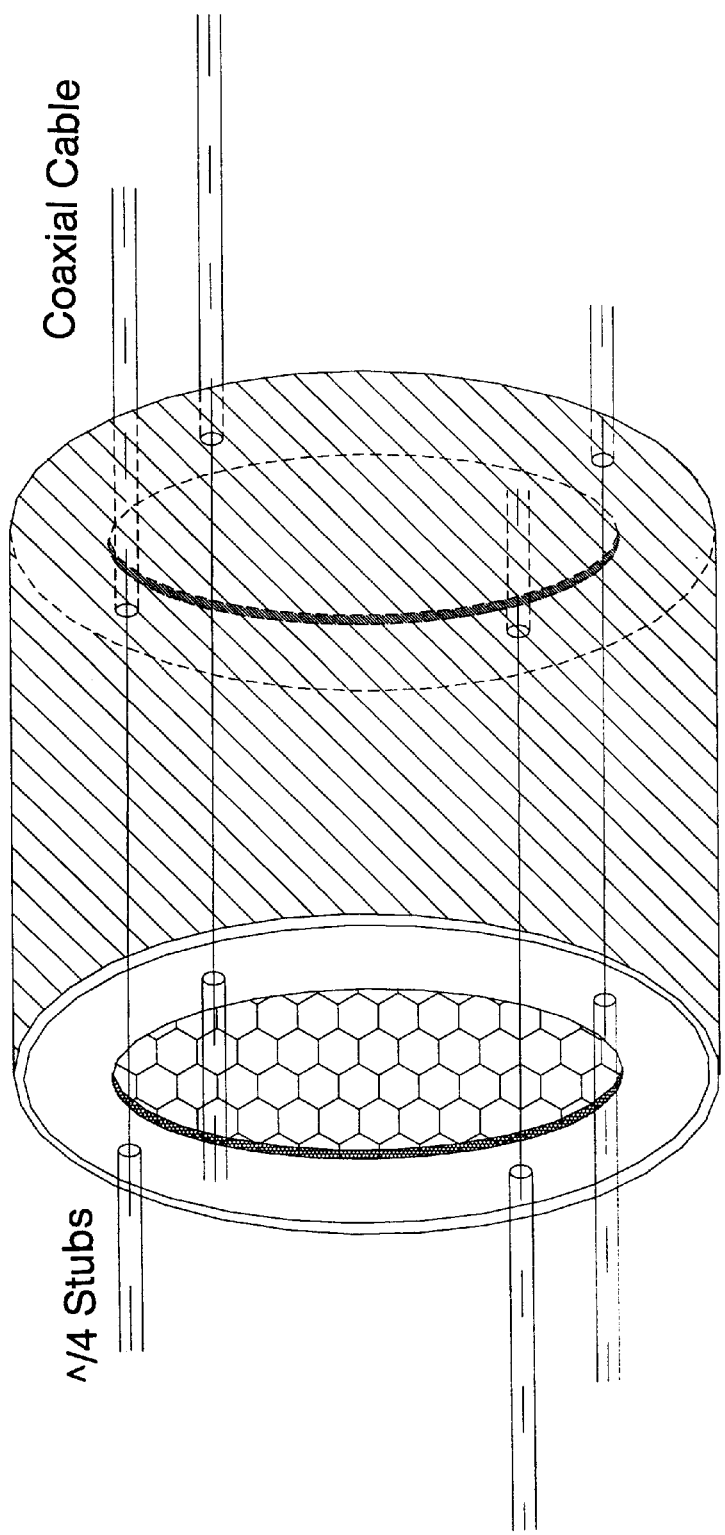
FIG. 6 shows the assembly of a linear mode HFLVR. Coaxial cables are fed through the assembly. The coaxial cable remains intact on the exterior of the HFLVR. On the interior of the HFLVR, the center conductor of the coaxial cable is exposed by removing the outer conductor of the coaxial cable (shield of the coaxial cable). The outer conductor is terminated on the inner surface of each toroidal transverse end plane. Four coaxial cables and 4 $\lambda/4$ stubs are shown. Discrete reactive components may be substituted for the stubs.
Figure 7:
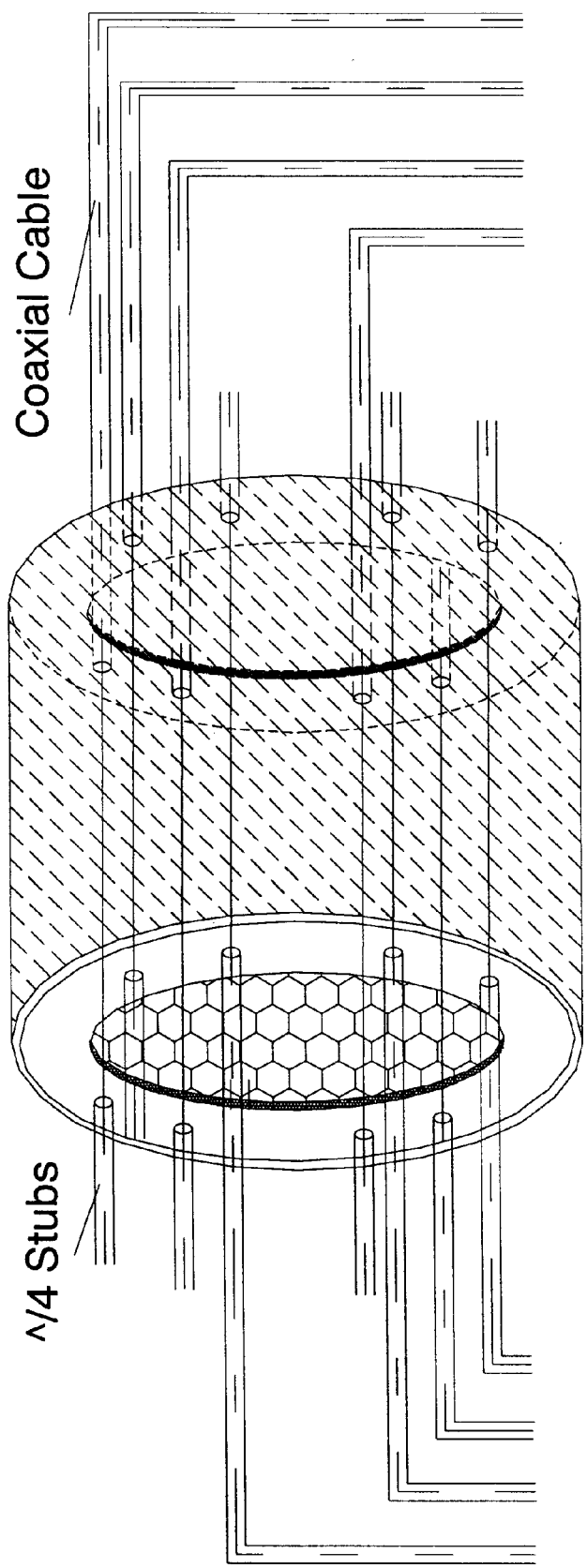
FIG. 7 shows the assembly of a Quad mode HFLVR. Coaxial cables are fed through the assembly. The coaxial cable remains intact on the exterior of the HFLVR. On the interior of the HFLVR, the center conductor of the coaxial cable is exposed by removing the outer conductor of the coaxial cable (shield of the coaxial cable). The outer conductor is terminated on the inner surface of each toroidal transverse end plane. Eight coaxial cables and 8 $\lambda/4$ stubs are shown. Discrete reactive components may be substituted for the stubs.
Figure 8:
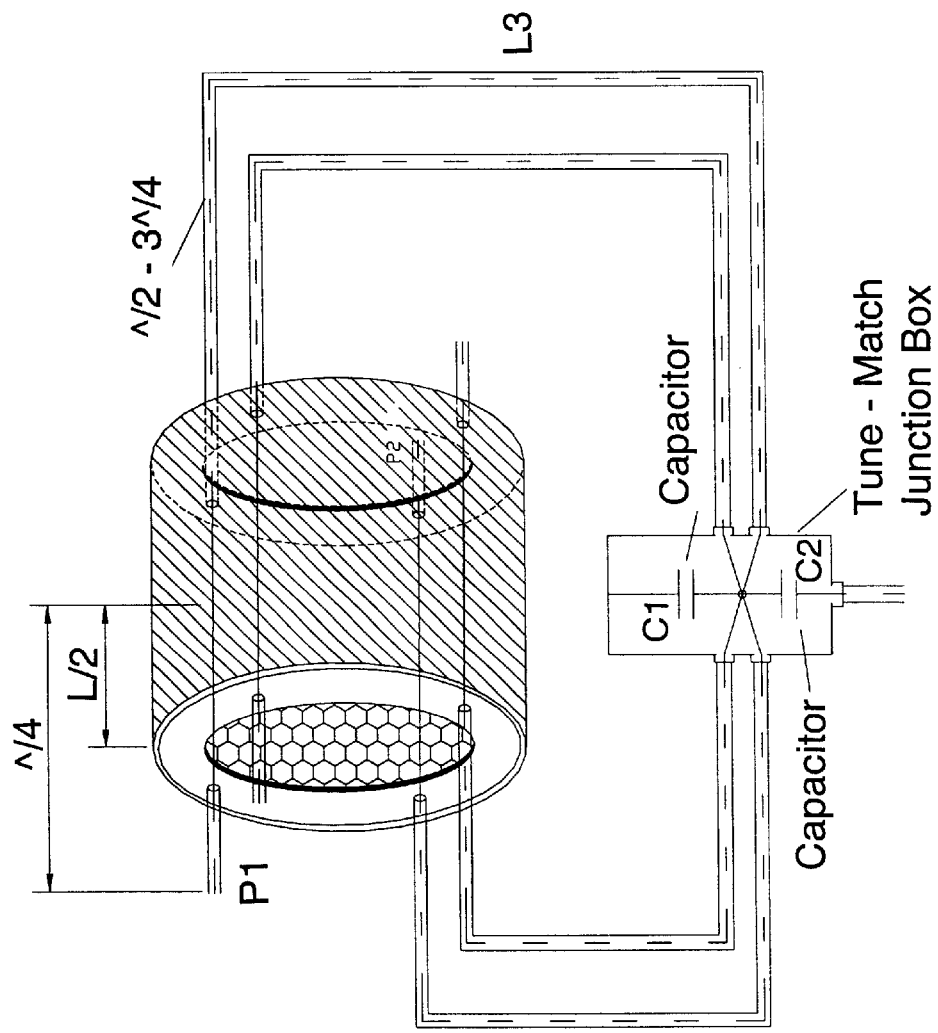
FIG. 8 shows the quarter wave ($\lambda/4$) point that exists on each of the coaxial cables within the HFLVR that corresponds to the center of the HFLVR (L/2). The length of the $\lambda/4$ segment is greater than the length L/2 so that the open end of the coaxial cable extends outside of the conductive cavity. Conversely, the voltage node that occurs at $\lambda/4$ for each of the coaxial cables coincides at the center of the HFLVR. The coaxial cable pairs P1 and P2 enter the conductive cavity shield in opposite directions. Also shown in FIG. 8 is the cable assembly of a linear mode HFLVR, wherein a ¼ wave ($\lambda/4$) point for a given frequency and a given coaxial cable corresponds to a point L/2 ($L_2 < \lambda/4$) from either end of the conductive cavity. The ends of the coaxial cables of pair $P_1$ extend outside of the conductive cavity and are open. Cable pair $P_2$ is constructed the same as $P_1$ with the open ends on the opposing end of conductive cavity. The length L3 is measured from the center of the conductive cavity to the point where the coaxial cable is connected to the tuning network. The length of L3 is described by the relationship, $\lambda/2 < L3 < 3\lambda/4$. This relationship persists for all coaxial cables in quad and linear modes. Further shown in FIG. 8 is a tuning and matching network housed within a conductive box connecting all outer conductors. The center conductors are connected inside the conductive box at a common point, wherein capacitors $C_1$ and $C_2$ are for tuning and matching. One tuning and matching network is needed for linear mode operation and two tuning and matching networks are needed for quad mode operation. The design of the tuning and matching network is not limited to the described design.

An alternative outer structure of the coil may be implemented for linear or quad mode operation based on the previous two examples, wherein end rings are added to the coil to create space between the end rings and the toroidal transverse end planes for mounting capacitors and terminating cables within the coil structure (FIG. 2A). Specifically, the imaging volume is limited to a length of 12" with addition 6" space in each end to allow for mounting of tuning-matching capacitors and sections of the coaxial cables (FIG. 2B). The conductive cavity shield is confined to the 12" volume within the inner toroidal transverse planes. The four toroidal transverse planes and the four connecting support tubes provide the support for the high frequency large volume resonator. An outer plastic skin is wrapped around the outer diameter of the high frequency large volume resonator. The conductive cavity is attached to the inner surface of the outer skin and is soldered to the copper foil in the inner surface of the inner toroidal transverse planes. The 26" diameter of the outer shell and the inner diameter of 22" of the toroidal transverse end planes allows for maximum subject insertion volume.

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. The present examples along with the methods, procedures, treatments, molecules, and specific compounds described herein are presently representative of preferred embodiments, are exemplary, and are not intended as limitations on the scope of the invention. Changes therein and other uses will occur to those skilled in the art which are encompassed within the spirit of the invention as defined by the scope of the claims.

What is claimed is:

1. A magnetic resonance imaging coil, comprising:
   a conductive cavity;
   a first toroidal transverse plane with holes therethrough, wherein said first transverse plane is connected to a first end of said conductive cavity;
   a second toroidal transverse plane with a holes therethrough, wherein said second transverse plane is connected to a second end of said conductive cavity; and
   coaxial cables, wherein said cables are fed through one of said transverse planes via said holes, through the conductive cavity and through the other of said transverse planes via said holes, each of said coaxial cables having:
      an open end; and
      an end opposing said open end,
   each of said open ends and said opposing ends terminating at a distance from said transverse plane and exterior to the conductive cavity, wherein each of said opposing ends is connected with a tuning-matching network.

2. The magnetic resonance imaging coil of claim 1, wherein an inner surface of said conductive cavity and of said toroidal transverse planes are covered with copper foil.

3. The magnetic resonance imaging coil of claim 2, wherein said copper foil is made of solid copper or copper mesh; and wherein said copper foil is fixed in position with adhesive.

4. A method of imaging a subject of large volume, comprising the step of:
   applying the magnetic resonance imaging coil of claim 1 to said subject in a magnetic field, thereby obtaining a magnetic resonance image.

5. The method of claim 4, wherein said magnetic field has a strength of at least 3 Tesla.

6. The method of claim 4, wherein said subject is a human body or an animal body.

7. A linear mode magnetic resonance imaging coil, comprising:
   a conductive cavity;
   a first toroidal transverse plane with four holes therethrough, wherein said first toroidal transverse plane is connected to the first end of said conductive cavity;
   a second toroidal transverse plane with four holes therethrough, wherein said second toroidal transverse plane is connected to the second end of said conductive cavity;
   two pairs of coaxial cables; wherein both cables in one pair are fed through said first transverse plane via said holes, through the conductive cavity and through said second transverse plane via said holes and both cables in said other pair are fed through said second transverse plane via said holes therein, through the conductive cavity and through said first transverse plane via said holes therein such that the cables within both of said cable pairs are separated by 60° and both of said cable pairs are separated by 180°; each of the cables in said cable pairs having;
      an open end; and
      an end opposing said open end, each of said open ends and said opposing ends terminating at a distance from said transverse plane and exterior to the conductive cavity, wherein each of said opposing ends is connected with a network.

8. The linear mode magnetic resonance imaging coil of claim 7, further comprising:
   end rings, wherein said end rings are attached to an outer shell of said coil, thereby creating space between the rings and the toroidal transverse planes.

9. A method of imaging a subject of large volume, comprising the step of:
   applying the magnetic resonance imaging coil of claim 7 to said subject in a magnetic field, thereby obtaining a magnetic resonance image.

10. The method of claim 9, wherein said magnetic field has a strength of at least 3 Tesla.

11. The method of claim 9, wherein said subject is a human body or an animal body.

12. A method of imaging a subject of large volume, comprising the step of:
   applying the magnetic resonance imaging coil of claim 8 to said subject in a magnetic field, thereby obtaining a magnetic resonance image.

13. A quad mode magnetic resonance imaging coil, comprising:

a conductive cavity;

a first toroidal transverse plane with eight holes therethrough, wherein said first toroidal transverse plane is connected to the first end of said conductive cavity;

a second toroidal transverse plane with eight holes therethrough, wherein said second toroidal transverse plane is connected to the second end of said conductive cavity; and four pairs of coaxial cables, wherein both cables in two pairs of said four pairs of coaxial cables are fed through said first transverse plane via said holes, through the conductive cavity and through said second transverse plane via said holes and both cables in the other two pairs of said four pairs of coaxial cables are fed through said second transverse plane via said holes, through the conductive cavity and through said first transverse plane via said holes such that the cables within each of said cable pairs are separated by 60°, each of said four cable pairs are separated by 90°, said four cable pairs forming two sets of opposing pairs, wherein each of the cables in said four cable pairs has;

an open end; and an end opposing said open end, each of said open ends and said opposing ends terminating at a distance from said transverse plane and exterior to the conductive cavity; wherein said opposing ends of one of the two opposing pairs are connected to a first tuning-matching networks and said opposing ends of the other of the two opposing pairs are connected to a second tuning-matching network, wherein the two tuning-matching networks are driven by a 90° phase shifted power splitter.

14. The quad mode magnetic resonance imaging coil of claim 13, further comprising:

end rings, wherein said end rings are attached to an outer shell of said coil, thereby creating space between the rings and the toroidal transverse planes.

15. A method of imaging a subject of large volume, comprising the step of:

applying the magnetic resonance imaging coil of claim 13 to said subject in a magnetic field, thereby obtaining a magnetic resonance image.

16. The method of claim 15, wherein said magnetic field has a strength of at least 3 Tesla.

17. The method of claim 15, wherein said subject is a human body or an animal body.

18. A method of imaging a subject of large volume, comprising the step of:

applying the magnetic resonance imaging coil of claim 14 to said subject in a magnetic field, thereby obtaining a magnetic resonance image.

19. The magnetic resonance imaging coil of claim 1, wherein outer conductors of said coaxial cables are terminated on an inner surface of said first toroidal transverse plane and of said second toroidal transverse plane such that those segments of said coaxial cables disposed within said conductive cavity have inner conductors exposed thereto.

20. The linear mode magnetic resonance imaging coil of claim 7, wherein outer conductors of said coaxial cables are terminated on an inner surface of said first toroidal transverse plane and of said second toroidal transverse plane such that those segments of said coaxial cables disposed within said conductive cavity have inner conductors exposed thereto.

21. The quad mode magnetic resonance imaging coil of claim 13, wherein outer conductors of said coaxial cables are terminated on an inner surface of said first toroidal transverse plane and of said second toroidal transverse plane such that those segments of said coaxial cables disposed within said conductive cavity have inner conductors exposed thereto.

* * * * *